United States Patent
Wang (10) Patent No.: US 10,353,017 B2
(45) Date of Patent: Jul. 16, 2019

(54) HALL EFFECT SENSOR AND SYSTEM WITH IMPROVED SENSITIVITY

(71) Applicant: The Timken Company, North Canton, OH (US)

(72) Inventor: Lei Wang, Solon, OH (US)

(73) Assignee: The Timken Company, North Canton, OH (US)

( * ) Notice: Subject to any disclaimer, the term of this patent is extended or adjusted under 35 U.S.C. 154(b) by 249 days.

(21) Appl. No.: 15/324,845

(22) PCT Filed: Aug. 13, 2014

(86) PCT No.: PCT/US2014/050889
§ 371 (c)(1),
(2) Date: Jan. 9, 2017

(87) PCT Pub. No.: WO2016/024966
PCT Pub. Date: Feb. 18, 2016

(65) Prior Publication Data
US 2017/0205472 A1    Jul. 20, 2017

(51) Int. Cl.
*G01R 33/00* (2006.01)
*G01R 33/07* (2006.01)
(Continued)

(52) U.S. Cl.
CPC ......... *G01R 33/0005* (2013.01); *G01D 5/145* (2013.01); *G01P 3/44* (2013.01); *G01R 33/07* (2013.01)

(58) Field of Classification Search
CPC .... G01R 33/0005; G01R 33/07; G01D 5/145; G01P 3/44
(Continued)

(56) References Cited

U.S. PATENT DOCUMENTS

| 7,372,119 B2 * | 5/2008 | Nakamura | G01R 33/07 |
| | | | 257/427 |
| 8,427,140 B2 * | 4/2013 | Hioka | G01R 33/07 |
| | | | 324/207.2 |

(Continued)

OTHER PUBLICATIONS

International Search Report and Written Opinion for Application No. PCT/US2014/050889 dated Aug. 13, 2014.
(Continued)

*Primary Examiner* — Melissa J Koval
*Assistant Examiner* — Rahul Maini
(74) *Attorney, Agent, or Firm* — Michael Best & Friedrich LLP (57) ABSTRACT

A Hall effect sensor system for detecting magnetic fields includes a Hall effect sensor having a central body with a substantially square shape, a first pair of outwardly oriented and opposing arms projecting outwardly from opposing sides of the central body and a second pair of outwardly oriented and opposing arms projecting outwardly transverse from the first pair of arms to form a cross-shape. Each of the arms has a plurality of fingers projecting outwardly therefrom and electrodes are provided on the fingers. In operation, at least two electrodes on the first pair of opposing arms provide a path for bias current through the Hall effect sensor. An electrode on each of the second pair of opposing arms senses voltage formed in the Hall effect sensor by a magnetic field and provides an output to an amplifier.

16 Claims, 5 Drawing Sheets

(51) Int. Cl.
*G01D 5/14* (2006.01)
*G01P 3/44* (2006.01)

(58) Field of Classification Search
USPC .................................. 324/207.2; 338/32 H
See application file for complete search history.

(56) References Cited

U.S. PATENT DOCUMENTS

| | | |
|---|---|---|
| 2004/0164840 A1 | 8/2004 | Xiao et al. |
| 2014/0009143 A1* | 1/2014 | Blagojevic ............. G01R 33/07 324/244 |
| 2014/0070795 A1 | 3/2014 | Kolb et al. |

OTHER PUBLICATIONS

Kammerer et al., "Horizontal Hall Effect Sensor With High Maximum Absolute Sensitivity," IEEE Sensors Journal, 2003, vol. 3, No. 6, pp. 700-707.

* cited by examiner

HALL EFFECT SENSOR AND SYSTEM WITH IMPROVED SENSITIVITY

BACKGROUND

The present invention relates to a Hall effect sensor including multiple electrodes on plural arms and other arrangements for improving sensitivity in the detection of a magnetic field.

Hall effect sensors are known for detecting magnetic fields for various purposes. A spinning current technique is known wherein, first a bias circuit drives bias current through a Hall effect sensor and sensing electrodes are disposed transverse from the bias current on opposing sides of the sensor. Next, the bias circuit drives bias current through the Hall effect sensor at 90 degrees to, or transverse of, the first bias current application direction. Thus, the Hall effect sensor is sampled sequentially or alternatively to determine motion or a change in movement of a magnet or the like.

SUMMARY

The invention is a Hall effect sensor provided as a symmetric cross-shaped Hall effect element with multiple electrodes on fingers of plural arms to obtain improved sensitivity to detect the presence and/or strength of a magnetic field.

In one embodiment, the invention is a Hall effect sensor comprising: a central body having a substantially rectangular shape; a first pair of outwardly oriented and opposing arms projecting outwardly from opposing sides of the central body, the first pair of the opposing arms each having a plurality of electrodes provided thereon proximate an outer edge of the respective arm, the plural electrodes being spaced from each other; and a second pair of outwardly oriented and opposing arms projecting outwardly from the central body. The second pair of the opposing arms are oriented transverse to the first pair of opposing arms, the second pair of opposing arms each including a plurality of electrodes thereon proximate an outer edge of the respective arm, the plural electrodes being spaced from each other.

In another embodiment, a Hall effect sensor system for detecting at least one of a speed and a position of a rotatable member, includes a Hall effect sensor comprising: a first pair of opposing arms, each of the arms including a plurality fingers projecting outwardly therefrom, wherein the fingers on each of the arms include an electrode, and a second pair of opposing arms, each of the second pair of opposing arms including a plurality of fingers projecting outwardly therefrom, wherein the fingers on each of the arms include an electrode; and a bias current source providing a bias current through at least one the electrode on a first one of the first pair of the opposing arms, the second one of the first pair of opposing arms providing a ground path for the bias current. A sensing voltage is sensed by one of the electrodes provided with a first one of the second pair of opposing arms and sensed by one of the electrodes provided with a second one of the second pair of opposing arms.

In another embodiment, the invention provides a method for driving a Hall effect sensor, the Hall effect sensor comprising a central body having a substantially rectangular shape, a first pair of outwardly oriented and opposing arms projecting outwardly from opposing sides of the central body, the first pain of opposing arms each having a plurality of electrodes provided thereon proximate an outer edge of the respective arm, the plurality of electrodes being spaced from each other, and a second pair of outwardly oriented and opposing arms projecting outwardly from the central body, the second pair of opposing arms being oriented transverse to the first pair of arms, the second pair of arms each including a plurality of electrodes. The method comprises the steps of supplying a bias current from at least one bias current source to at least one of the plurality of electrodes of one of the first pair of opposing arms, and at least one of the electrodes of the other arm of the first pair of opposing arms providing a ground path for the bias current, and sensing voltage across the second pair of opposing arms, at least one electrode of each of the second pair of arms providing a sensor signal to an amplifier, the amplifier providing an output corresponding to a Hall effect value for the Hall effect sensor.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
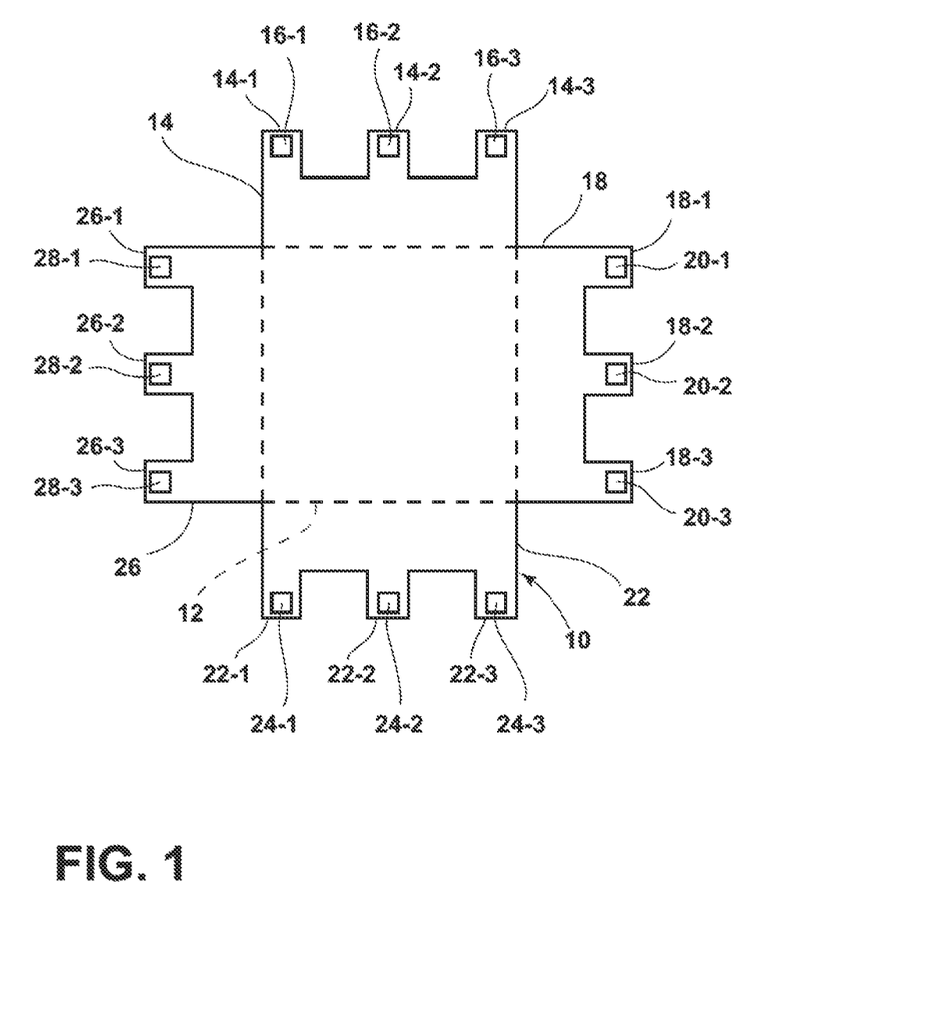
FIG. 1 shows a top view of a Hall effect sensor of the invention.

FIG. 1 shows a Hall effect sensor 10 that includes a central body 12 and a plurality of arms with fingers. Arm 14 includes a plurality of fingers 14-1, 14-2, 14-3 that project outwardly away from the central body 12. Electrodes 16-1, 16-2, 16-3 are provided on the respective projecting fingers. Likewise, arm 18 includes a plurality of outwardly projecting fingers 18-1, 18-2, 18-3. Further, electrodes 20-1 to 20-3 are provided on the respective fingers 18-1, 18-2, 18-3 of the arm 18.

As shown in FIG. 1, the Hall effect sensor 10 includes an arm 22 in an opposing direction from the arm 14, and having a plurality of outwardly projecting fingers 22-1, 22-2, 22-3 that support respective electrodes 24-1, 24-2, 24-3. The arm 22 is in opposition to the arm 14 of the Hall effect sensor 10. Further, FIG. 1 shows the Hall effect sensor 10 with an arm 26 that is opposite to arm 18. The arm 26 includes a plurality of outwardly projecting fingers 26-1, 26-2, 26-3 that support electrodes 28-1, 28-2, 28-3.

The Hall effect sensor 10 shown in FIG. 1 is formed by the central body 12, the arms 14, 18, 22, 26 and the corresponding fingers as a single monolithic element. Further, the central body 12, the arms 14, 18, 22, 26 and the fingers are defined by a shared common plane. The Hall effect sensor 10 has an essentially flat cross shape. Thus, the Hall effect sensor 10 is a symmetrical cross-shaped Hall effect element.

Figure 2:
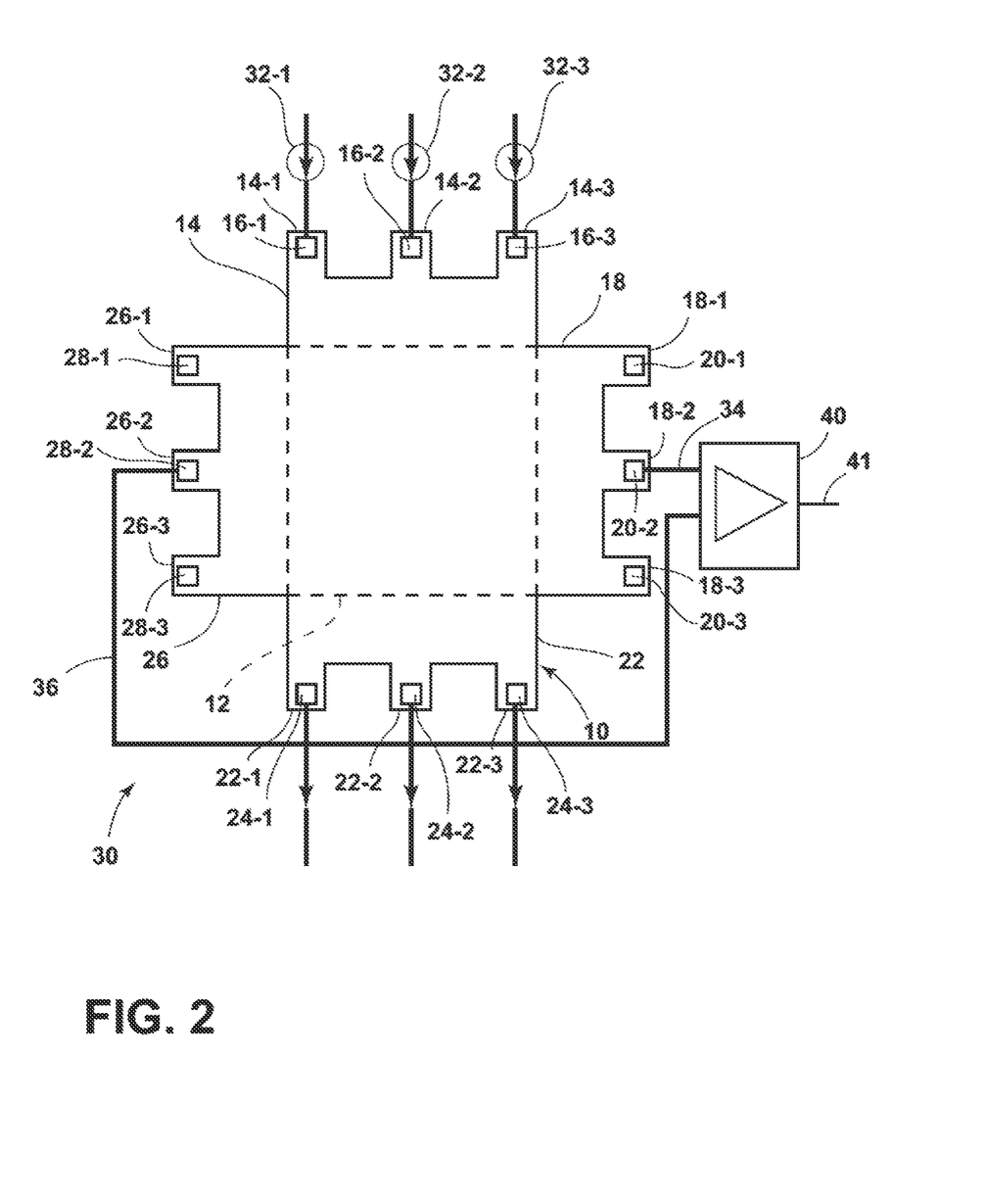
FIG. 2 shows a Hall effect sensor system that includes a current source for the Hall effect sensor and a sensing amplifier.

FIG. 2 shows an embodiment of a Hall effect sensor system 30, wherein current sources 32-1, 32-2, 32-3 input bias current to the electrodes 16-1, 16-2, 16-3 of the arm 16 of the Hall effect sensor 10 to enable sensing. The bias current passes through the central body 12 and travels to negative terminal of bias current circuit, for example, ground (GND) via electrodes 24-1, 24-2, 24-3 formed on the opposing arm 22. Thus, the bias current traverses essentially the entirety of the Hall effect sensor 10 via the arm 16, the central body 12 and the opposing arm 22.

In the FIG. 2 embodiment, the Hall effect sensor 10 is stationary and senses changes in magnetic field and field strength caused by, as an example, spaced magnets mounted to a rotating element that rotates near the Hall effect sensor. The magnets generate an output or sensing voltage across the electrodes 20-2, 28-2 of the pair of opposing arms 18, 26 of the Hall effect sensor that are transverse to the path of the bias current. In FIG. 2, the measured hall voltage is provided from the electrodes 20-2, 28-2 via connecting lines 34, 36 to an amplifier 40. The amplifier 40 provides an output for further processing.

Figure 3:
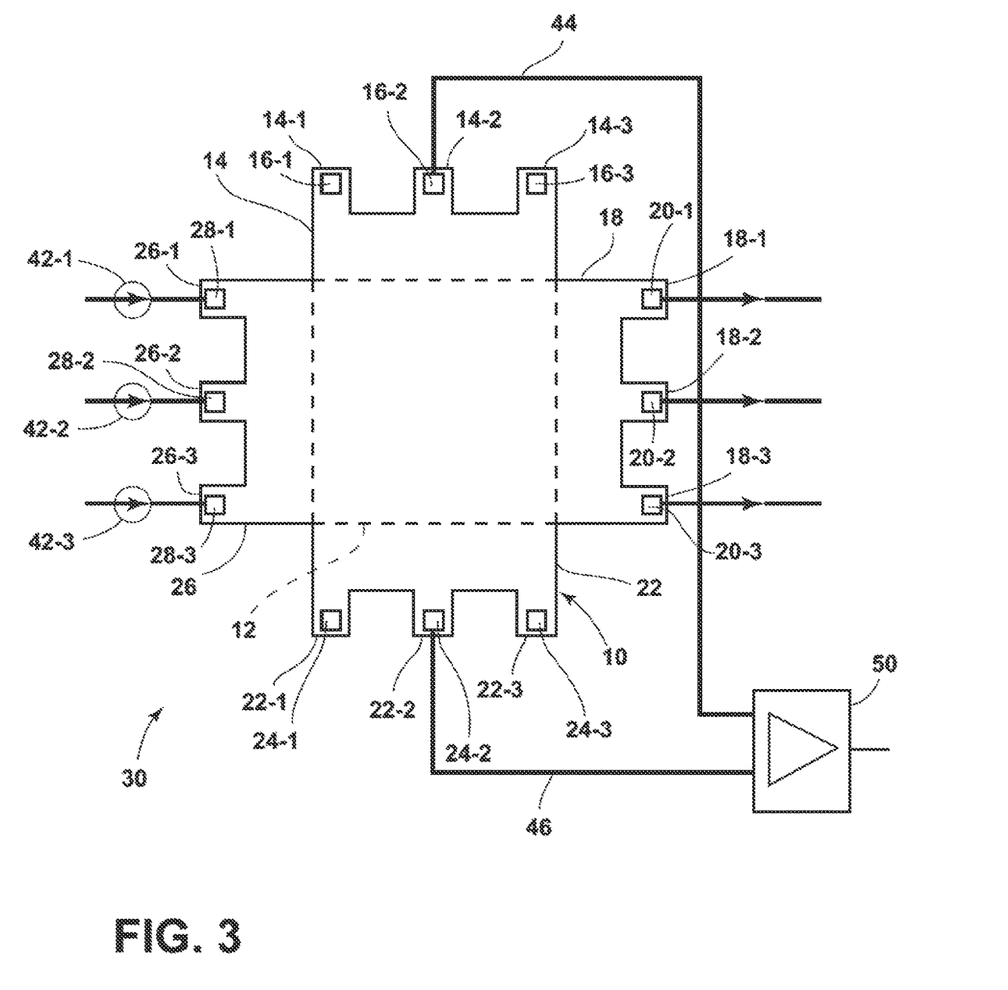
FIG. 3 shows the Hall effect sensor system of FIG. 2 with a current source and a sensing amplifier connected to electrodes on different arms of the Hall effect sensor.

FIG. 3 shows another operating state for the Hall effect sensor system 30 shown in FIG. 2. FIG. 3, in combination with FIG. 2, shows the Hall effect sensor 10 operating in a spinning current technique. The spinning current technique reduces Hall effect sensor and/or amplifier offset in the output. In the spinning current technique, switching circuitry (not shown) periodically acts to switch off or disconnect the current sources 32-1, 32-2, 32-3 shown in FIG. 2 from the electrodes 16-1, 16-2, 16-3 on arm 14 to prevent the flow of bias current through the Hall effect sensor 10. At the same time, the circuitry disconnects the amplifier 40 from the signal lines 34, 36. To provide bias current as shown in FIG. 3, the circuitry connects current sources 42-1, 42-2, 42-3 to the electrodes 28-1, 28-2, 28-3 provided on the fingers of the arm 26 of the Hall effect sensor 10. The electrodes 20-1, 20-2, 20-3 provided on the fingers of the opposing arm 18 of the Hall effect sensor 10 are connected to negative terminal of bias current circuit, for example, GND. Thus, in FIG. 3 the bias current flows through the Hall effect sensor 10 in a direction transverse to the path of the bias current shown in FIG. 2.

In FIG. 3, the circuitry also provides an electrical connection of the electrode 16-2 on the finger 14-2 of arm 14 to a connecting line 44 and an electrical connection of the electrode 24-2 on the finger 22-2 of the opposing arm 22 to a connecting line 46. The connecting lines 44, 46 provide the sensed electrical signals to an amplifier 50. The amplifier 50 provides an output for further signal processing. While a separate amplifier 50 is illustrated, in some embodiments switching circuitry switches the connections of the electrodes so that connecting lines 44, 46 connect to the amplifier 40, whereby the same amplifier provides an output at different times or cycles for the spinning technique.

In the embodiment shown in FIGS. 2 and 3, the switching circuitry alternates between the arrangements of FIGS. 2 and 3.

In another embodiment, the Hall effect sensor system 30 switches from the power and sensing arrangement in FIG. 2 to the power and sensing arrangement in FIG. 3. Further, switching circuitry operates the sensor system 30 to provide bias current to the electrodes on the arm 22 and to connect the electrodes on the arm 14 to negative terminal of the bias current circuit, for example, GND. Sensing voltage is sensed by at least one of the electrodes on the arm 18 and an electrode on the arm 26. Subsequently, the bias current is applied to one or more of the electrodes on the arm 18 and traverses the Hall effect sensor 10 to negative terminal of the bias current circuit, for example, GND via electrodes on fingers of the arm 26, while sensing voltage is sensed by at least one electrode on a finger of each of the arms 14, 22. The sensed voltage is applied to an amplifier, such as one of amplifiers 40, 50 by a switching circuit. Thereafter, the Hall effect sensor system 30 provides bias current in the arrangement shown in FIG. 2. This, current spinning technique provides bias current to electrodes on each of the arms of the Hall effect sensor 10 in sequence.

In the embodiments, the results from the amplifiers 40, 50 are processed to determine properties of, for example, a rotating member with magnets mounted thereon that is adjacent the Hall effect sensor 10. Properties include rotating shaft speed and rotating shaft position or angle. In other embodiments, the Hall effect sensor system 30 performs motion detection. In some embodiments, the Hall effect sensor system 30 also performs linear motion, magnetic field, magnetic field strength, and/or magnetic field strength change detection.

Figure 4:
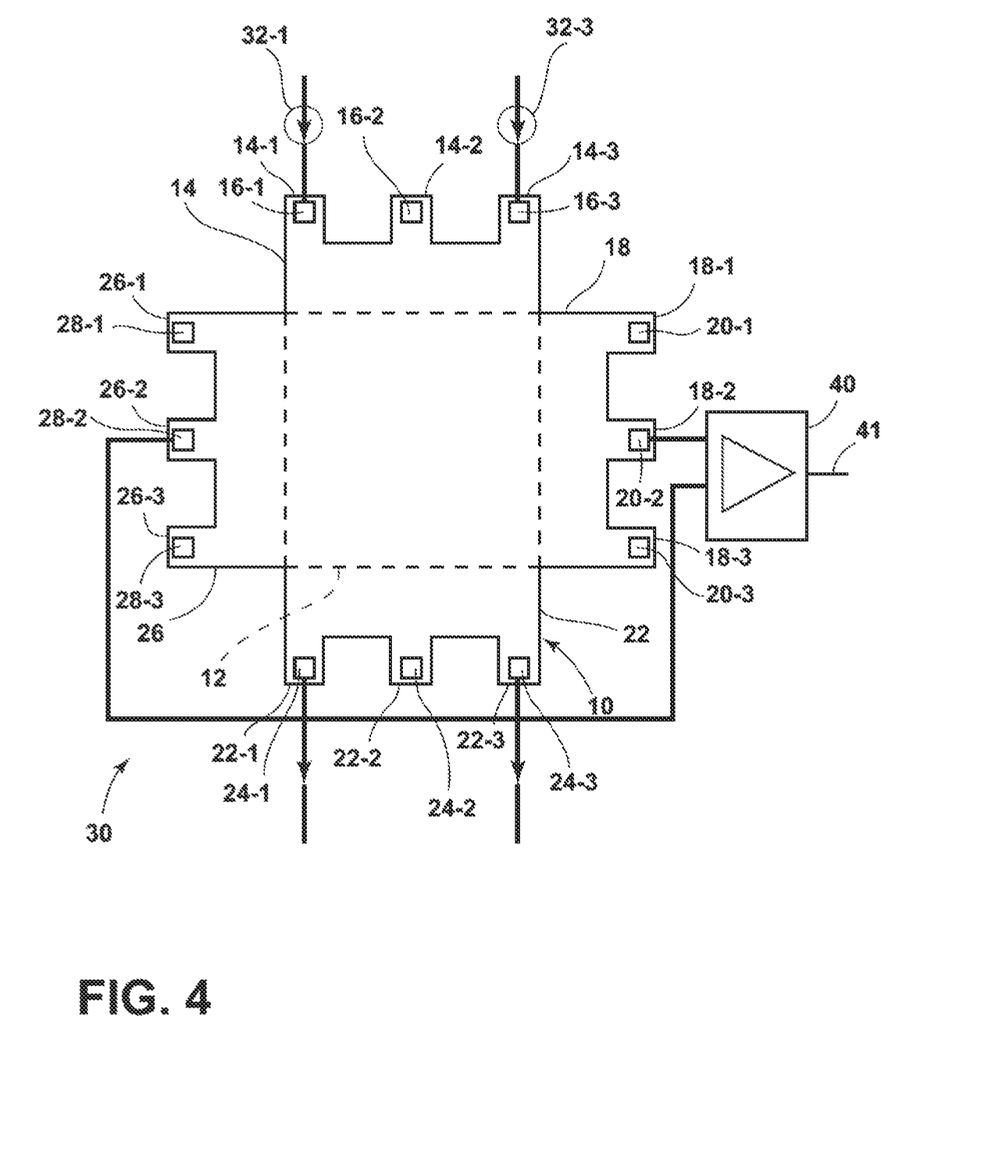
FIG. 4 shows the Hall effect sensor system with bias current applied to two of three electrodes on an arm of the Hall effect sensor.

FIG. 4 shows a different power arrangement for the Hall effect sensor system 30. In FIG. 4, bias current is provided to two of the electrodes disposed on arm 14 of the Hall effect sensor 10. More specifically, current sources 32-1, 32-3 input bias current to the electrodes 16-1, 16-3 of the arm 14 of the Hall effect sensor 10 to enable Hall effect sensing of magnetic field strength. The bias current passes through the Hall effect sensor 10 and travels to negative terminal of the bias current circuit, for example, GND via electrodes 24-1, 24-3 on fingers 22-1, 22-3 of the opposing arm 22. Thus, the bias current traverses essentially the entirety of the Hall effect sensor 10 via the arm 14, the central body 12 and to at least one electrode on at least one finger of the opposing arm 22.

In the FIG. 4 embodiment, voltage generated by changes in magnetic field, for example magnets mounted to a rotating element that rotates near the stationary Hall effect sensor 10, is output across the electrodes 20-2, 26-2 of the pair of opposing arms 18, 26 that are transverse to the path of the bias current. As in FIG. 2, the FIG. 4 measuring voltage is provided by the electrode 20-2 of the finger 18-2 of the arm 18 and the electrode 28-2 of the finger 26-2 of the arm 26. The measured voltage is provided via connecting lines 34, 36 to an amplifier 40. The amplifier 40 provides an output for further processing.

In the FIG. 4 embodiment, bias current is not provided to the central electrodes 16-2 and 28-2 of the hall effect sensor 10. Instead, bias current is periodically provided to the outer electrodes 16-1, 16-3 and 28-1, 28-3, respectively. Thus, switching connections to both provide bias current and to receive a sensing voltage from the central electrodes 16-2, 28-2 are not necessary. Therefore, the switching circuitry is simplified.

During current spinning of the FIG. 4 embodiment, the switching circuitry (not shown) switches to alternately provide bias current to electrodes 28-1, 28-3 on the arm 26 and to connect electrodes 20-1, 20-3 on arm 18 to negative terminal of bias current circuit, for example, GND. In some embodiments, instead of alternately switching the bias current between the electrodes of the arm 14 and the arm 26 of the hall effect sensor 10, the spinning continues by applying current to respective ones of the outer electrodes on fingers of the arms 22, 18 of the Hall effect sensor 10 in a similar manner as discussed above with respect to the arrangement of FIGS. 2 and 3.

Figure 5:
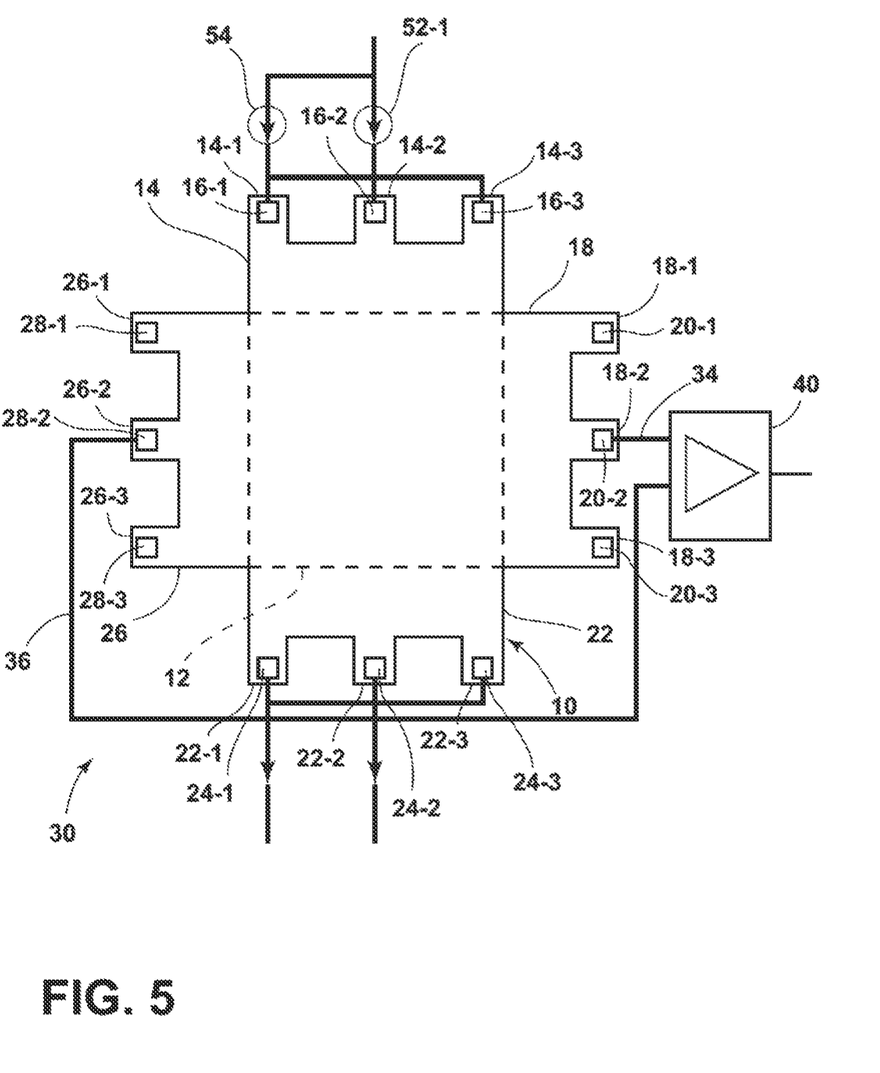
FIG. 5 Shows the Hall effect sensor system with different bias current connections to the electrodes of an arm of the Hall effect sensor.

FIG. 5 is essentially identical to the embodiment shown in FIGS. 2 and 3, except for the bias current arrangement. In FIG. 5, a current source 52-1 provides bias current to the middle electrode 16-2 on the arm 14 of the Hall effect sensor 10. The remaining the bias current is provided from current source 54 to the electrodes 16-1, 16-3, which are connected to each other. At the opposing arm 22, the circuitry provides a connection between the electrodes 24-1, 24-3, which are separate from the center electrode 24-2. The purpose of the FIG. 5 illustration is to show that the middle electrodes 16-2 and 24-2 are separately connectable relative to the adjacent outer electrodes thereby, while the electrodes 16-1, 16-3 and 24-1, 24-3 are directly connected to each other without affecting operation of the switching circuitry.

The arrangements with respect to the number of electrodes and the alignments thereof provide various advantages depending on the size of the Hall effect sensor 10 and various other features, including electrical properties thereof. For instance, as shown in the embodiment of FIG. 4, there is no need to provide bias current to each and every one of the electrodes on an arm of the Hall effect sensor (FIG. 2 embodiment). Instead, bias current is provided to two of three electrodes in FIG. 4. The other electrode on a finger of a respective arm provides sensing voltage generated by a change in a magnetic field. In this arrangement, bias electrodes are separated from sensing electrodes. This separation reduces circuit design complexity and reduces coupling between the bias circuit and the sensing circuit, so as to reduce noise.

Further, in the embodiments of FIGS. 2-5, center electrodes of the three electrodes shown on each arm are selected for sensing the Hall effect and providing an output. Other end electrodes are also usable for voltage sensing. Further, while a single electrode on each of a pair of arms is disclosed for sensing a Hall effect signal caused by movement of a magnet, in other embodiments two or more electrodes on each of a pair of opposing arms provide the voltage sensing.

While three electrodes are shown on the fingers of each of the arms 14, 18, 22, 26 in FIGS. 1-5, in some embodiments, only two electrodes are provided. In other embodiments from two to twelve or more electrodes secured to corresponding fingers are contemplated for each of the arms. Geometric factors, such as the size of the fingers and arms, along with the size of the electrodes, are important in determining the best arrangement to improve the sensitivity of the Hall effect sensor 10.

FIGS. 1-5 each show providing fingers on each of the arms to support the electrodes. The fingers avoid current leakage from the electrodes provided thereon. In some embodiments, however, the electrodes are formed on the respective arms 14, 18, 22, 26 without the use of outwardly protruding fingers.

By using a plurality of fingers with electrodes on the arms to provide the bias current, low resistance is provided for the bias current of the Hall effect sensor. Further, providing a small contact area for electrodes used for sensing voltage reduces geometric leak so as to increase sensor sensitivity. Therefore, in some embodiments the electrode for sensing voltage is smaller in size than the other electrodes that provide bias current to the Hall effect sensor 10. Further, the small electrode size permits a greater length-to-width ratio for Hall effect sensors as compared to sensors without small electrodes. Such embodiments do not require current spinning.

While the embodiments are illustrated in the drawings as comprising an essentially square symmetrical cross-shaped Hall effect sensor, rounded edges are contemplated for the corners while maintaining a generally square shape. In one embodiment, the central body of the Hall effect sensor has a square shape and the arms consist of four arms projecting outwardly from respective sides of the square shaped central body, the sides of the central body having a common length that is essentially the same as a corresponding width of the arms that are joined thereto, and wherein the Hall effect sensor is symmetric along an axis traversing through a center of a first pair of opposing arms and symmetric along an axis traversing through a center of a second pair of opposing arms. Further, a rectangular shape for the central body 12 of the Hall effect sensor is contemplated.

In one embodiment, the Hall effect sensor 10 is part of an application specific integrated circuit (ASIC), such as an encoder that detects at least one of a speed and a position of a rotatable member by detecting changes in magnetic field and strength. In some embodiments, the rotatable member is a shaft of an electrical motor for a pump or other device. In other embodiments, the sensor is used in magnetic field detecting devices and motion detection devices, as well as electrical motors and other control devices.

While the illustrated embodiments show four arms for the Hall effect sensor 10, in other arrangements, fewer or more arms are provided for the Hall effect sensor. Further, the Hall effect sensor 10, along with the amplifiers 40, 50 and other circuitry, typically is integrated into semiconductor material, such as silicon, using a CMOS process.

While only a single Hall effect sensor 10 is illustrated, providing a plurality of Hall effect sensors for a Hall effect sensor system is contemplated herein.

Thus, the invention provides, among other things, a Hall effect sensor with arms having plural electrodes on fingers of the arms to improve bias current resistance and to improve the geometric factor. Various features and advantages of the invention are set forth in the following claims.

What is claimed is:

1. A Hall effect sensor system for detecting at least one of a speed and a position of a rotatable member, the Hall effect sensor system comprising:
   a Hall effect sensor comprising:
      a first pair of opposing arms, each of the first pair of opposing arms including at least three fingers projecting outwardly therefrom, wherein each of the at least three fingers on each of the first pair of opposing arms includes a respective electrode, and
      a second pair of opposing arms, each of the second pair of opposing arms including at least three fingers projecting outwardly therefrom, wherein each of the at least three fingers on each of the second pair of opposing arms includes a respective electrode; and
   a bias current source providing a bias current to at least two of the respective electrodes provided on the at least three fingers on a first one of the first pair of the opposing arms, at least one of the respective electrodes on a second one of the first pair of opposing arms providing a ground path for the bias current,
   wherein only one of the respective electrodes provided with a first one of the second pair of opposing arms and only one of the respective electrodes provided with a second one of the second pair of opposing arms is used to sense voltage to measure a magnetic field.

2. The sensor system of claim 1, wherein the Hall effect sensor comprises a cross-shaped Hall effect element, and the second pair of opposing arms are oriented transverse to the first pair of the opposing arms.

3. The sensor system of claim 2, wherein the Hall effect sensor comprises a central body having a substantially square shape and the Hall effect sensor includes the first pair of opposing arms and the second pair of opposing arms.

4. The sensor system of claim 1, wherein the ground path includes at least two of the respective electrodes on at least two of the at least three fingers of the second one of the first pair of opposing arms that is directly opposing the first one of the first pair of opposing arms having the respective electrodes providing the bias current so that the bias current passes through the central body and the first pair of opposing arms of the Hall effect sensor.

5. The sensor system of claim 1, further comprising an amplifier and connectors, wherein the second pair of opposing arms are located transverse to the first pair of the arms, and each of the second pair of opposing arms includes the only one of the respective electrodes that provides an output signal to a respective one of the connectors that connects to the amplifier.

6. The sensor system according to claim 1, wherein the central body of the Hall effect sensor, the first pair of opposing arms, the second pair of opposing arms, and each of the respective fingers provided therewith, have a shared common plane, whereby the Hall effect sensor has a substantially flat shape.

7. The sensor system according to claim 6, wherein the central body of the Hall effect sensor has a substantially square shape.

8. The sensor system according to claim 7, wherein each of the first pair of opposing arms and the second pair of opposing arms projects outwardly from respective sides of the square shaped central body.

9. The sensor system according to claim 8, wherein the sides of the central body have a common length that is essentially the same as a corresponding width of each of the first pair of opposing arms and the second pair of opposing arms joined thereto.

10. The sensor system according to claim 9, wherein the Hall effect sensor is symmetric along a first axis traversing a center of the first pair of the opposing arms and symmetric along a second axis traversing a center of the second pair of the opposing arms.

11. The sensor system of claim 1, wherein the only one of the respective electrodes provided with the first one of the second pair of opposing arms is a respective center electrode of the first one of the second pair of opposing arms, and wherein the only one of the respective electrodes provided with the second one of the second pair of opposing arms is a respective center electrode of the second one of the second pair of opposing arms.

12. A method for driving a Hall effect sensor, the Hall effect sensor comprising a central body having a substantially rectangular shape, a first pair of outwardly oriented and opposing arms projecting outwardly from opposing sides of the central body, the first pair of outwardly oriented and opposing arms each including at least three fingers projecting outwardly from the central body and spaced from one another, wherein each of the at least three fingers on each of the first pair of outwardly oriented and opposing arms includes a respective electrode and a second pair of outwardly oriented and opposing arms projecting outwardly from opposing sides of the central body, the second pair of outwardly oriented and opposing arms each including at least three fingers projecting outwardly from the central body, wherein each of the at least three fingers on each of the second pair of outwardly oriented and opposing arms includes a respective electrode, the second pair of outwardly oriented and opposing arms being oriented transverse to the first pair of outwardly oriented and opposing arms, the method comprising the steps of:

supplying a bias current from at least one bias current source to at least two of the respective electrodes of one of the first pair of outwardly oriented and opposing arms, and at least one of the respective electrodes of a second of the first pair of outwardly oriented and opposing arms providing a ground path for the bias current, and using only one of the respective electrodes of each of the second pair of outwardly oriented and opposing arms to sense a voltage and provide a sensor signal to an amplifier, the amplifier providing an output corresponding to a Hall effect value for the Hall effect sensor.

13. The method of claim 12, further comprising the steps of:

performing current spinning by providing the bias current to the respective electrodes of the one of the first pair of outwardly oriented and opposing arms while sensing voltage across each of the second pair of outwardly oriented and opposing arms, and subsequently providing the bias current to the respective electrodes of one of the second pair of outwardly oriented and opposing arms while sensing voltage across each of the first pair of outwardly oriented and opposing arms.

14. The method of claim 12, wherein the central body, the first pair of outwardly oriented and opposing arms, and the second pair of outwardly oriented and opposing arms are monolithic.

15. The method of claim 12, wherein at least one of the respective electrodes of the at least three fingers of each of the first pair of outwardly oriented and opposing arms and the second pair of outwardly oriented and opposing arms includes a first electrical contact area that is less than a second electrode contact area of the other respective electrodes of the at least three fingers of each of the first pair of outwardly oriented and opposing arms and the second pair of outwardly oriented and opposing arms.

16. The method of claim 12, wherein the only one of the respective electrodes of each of the second pair of outwardly oriented and opposing arms is a respective center electrode of each of the second pair of outwardly oriented and opposing arms.

* * * * *